US010432314B2

(12) United States Patent
Li et al.

(10) Patent No.: US 10,432,314 B2
(45) Date of Patent: Oct. 1, 2019

(54) METHOD AND APPARATUS FOR STARTING AN OPTICAL MODULE

(71) Applicants: HISENSE BROADBAND MULTIMEDIA TECHNOLOGIES CO., LTD, Shandong (CN); HISENSE USA CORPORATION, Suwanee, GA (US); HISENSE INTERNATIONAL CO., LTD., Shandong OT (CN)

(72) Inventors: Shaobo Li, Shandong (CN); Ping Zhao, Shandong (CN)

(73) Assignees: Hisense Broadband Multimedia Technologies Co., Ltd., Shandong (CN); Hisense USA Corporation, Suwanee, GA (US); Hisense International Co., Ltd., Shandong (CN)

( * ) Notice: Subject to any disclaimer, the term of this patent is extended or adjusted under 35 U.S.C. 154(b) by 45 days.

(21) Appl. No.: 15/286,053

(22) Filed: Oct. 5, 2016

(65) Prior Publication Data

US 2017/0025810 A1 Jan. 26, 2017

(30) Foreign Application Priority Data

Mar. 31, 2016 (CN) .......................... 2016 1 0202419

(51) Int. Cl.
*H01S 5/024* (2006.01)
*H01S 3/06* (2006.01)
(Continued)

(52) U.S. Cl.
CPC ....... *H04B 10/503* (2013.01); *H01S 5/02415* (2013.01); *H01S 5/0617* (2013.01);
(Continued)

(58) Field of Classification Search
CPC ............. H01S 5/06837; H01S 5/02415; H01S 5/0617; H01S 5/4025; H01S 155/4025; H04J 14/02; H04B 10/503
See application file for complete search history.

(56) References Cited

U.S. PATENT DOCUMENTS 6,369,926 B1  4/2002  Lyu et al.
2006/0145051 A1* 7/2006  Kawai ..................... H01S 5/068
250/201.1
(Continued)

FOREIGN PATENT DOCUMENTS

CN        1717849 A      1/2006
CN      203788288 U      8/2014

OTHER PUBLICATIONS

DWDM Accurate Wavelength Transmitter Applied in EPON, with English Abstract, pp. 1-65.

*Primary Examiner* — Yuanda Zhang
(74) *Attorney, Agent, or Firm* — Hoffmann & Baron, LLP

(57) ABSTRACT

The application discloses a method and apparatus for starting an optical module. The method includes: adjusting temperature of a laser device of the optical module to a first temperature higher than a normal operating temperature of the laser device of the optical module; powering up the laser device of the optical module using a first current lower than a normal operating current of the laser device; and adjusting the temperature of the laser device of the optical module from the first temperature to the normal operating temperature according to a second temperature corresponding to each adjustment, and adjusting the current of the laser device of the optical module from the first current to the normal operating current according to a second current corresponding to each adjustment, for a preset times of adjustment.

13 Claims, 5 Drawing Sheets

(51) Int. Cl.
  H04B 10/50 (2013.01)
  H01S 5/06 (2006.01)
  H01S 5/0683 (2006.01)
  H01S 5/40 (2006.01)
  H04J 14/02 (2006.01)

(52) U.S. Cl.
  CPC ........ H01S 5/06837 (2013.01); H01S 5/4025 (2013.01); H04J 14/0227 (2013.01)

(56) References Cited

U.S. PATENT DOCUMENTS

2008/0107431 A1   5/2008   Lee et al.
2014/0300952 A1*  10/2014  Gusev ................ H01S 5/06216
                                                       359/341.5
2015/0063812 A1   3/2015   Dove et al.

* cited by examiner

METHOD AND APPARATUS FOR STARTING AN OPTICAL MODULE

CROSS-REFERENCE TO RELATED APPLICATIONS

This application claims the benefit of Chinese Patent Application No. 201610202419.4, filed with the Chinese Patent Office on Mar. 31, 2016 and entitled "Method and apparatus for starting an optical module", which is hereby incorporated by reference in its entirety.

FIELD

The present application relates to the field of optical communications, and particularly to a method and apparatus for starting an optical module.

BACKGROUND

Dense Wavelength Division Multiplexing (DWDM) optical modules are very important devices in an existing wavelength division transmission system, and include a miniature pluggable optical transceiver module (SFP+), a 10 G miniature pluggable optical transceiver module (XFP), etc. Generally the DWDM optical modules operate in different frequency bands corresponding to different wavelengths as required in a standard.

SUMMARY

An embodiment of the application provides a method for starting an optical module, the method including:

adjusting temperature of a laser device of the optical module to a first temperature higher than a normal operating temperature of the laser device of the optical module;

powering up the laser device of the optical module using a first current lower than a normal operating current of the laser device; and adjusting the temperature of the laser device of the optical module from the first temperature to the normal operating temperature according to a second temperature corresponding to each adjustment, and adjusting the current of the laser device of the optical module from the first current to the normal operating current according to a second current corresponding to each adjustment, for a preset times of adjustment.

An embodiment of the application further provides an apparatus for starting an optical module, the apparatus including:

a first adjusting unit configured to adjust temperature of a laser device of the optical module to a first temperature higher than a normal operating temperature of the optical module; and a starting unit configured to power up the laser device of the optical module using a first current lower than a normal operating current of the laser device; and to adjust the temperature of the laser device of the optical module from the first temperature to the normal operating temperature according to a second temperature corresponding to each adjustment, and to adjust the current of the laser device of the optical module from the first current to the normal operating current, for a preset times of adjustment.

An embodiment of the application provides another method for starting an optical module, the method including:

adjusting temperature of a laser device of the optical module from initial temperature to a first adjustment temperature;

adjusting current of the laser device of the optical module from initial current to a first adjustment current;

determining whether the first adjustment temperature is higher than a normal operating temperature of the laser device of the optical module, and the first adjustment current is lower than a normal operating current of the laser device of the optical module; and if so, then adjusting the temperature of the laser device of the optical module to a second adjustment temperature, and the current of the laser device of the optical module to a second adjustment current.

An embodiment of the application further provides another apparatus for starting an optical module, the apparatus including:

a second adjusting unit configured to adjust temperature of a laser device of the optical module from initial temperature to a first adjustment temperature, and to adjust current of the laser device of the optical module from initial current to a first adjustment current; and a determining and adjusting unit configured to determine whether the first adjustment temperature is higher than a normal operating temperature of the laser device of the optical module, and the first adjustment current is lower than a normal operating current of the laser device of the optical module; and if so, to adjust the temperature of the laser device of the optical module to a second adjustment temperature, and the current of the laser device of the optical module to a second adjustment current.

BRIEF DESCRIPTION OF THE DRAWINGS

In order to make the technical solutions according to the embodiments of the application more apparent, the drawings to which a description of the embodiments refers will be briefly introduced below, and the drawings to be described below are merely illustrative of some of the embodiments of the application, and those ordinarily skilled in the art can derive from these drawings other drawings without any inventive effort. In the drawings.

DETAILED DESCRIPTION OF THE EMBODIMENTS

In order to make the objects, technical solutions, and advantages of the application more apparent, the application will be described below in further detail with reference to the drawings, and the embodiments described below are only a part but not all of the embodiments of the application. Based upon the embodiments here of the application, all of the other embodiments which can occur to those skilled in the art without any inventive effort shall fall into the scope of the application.

Figure 1A:
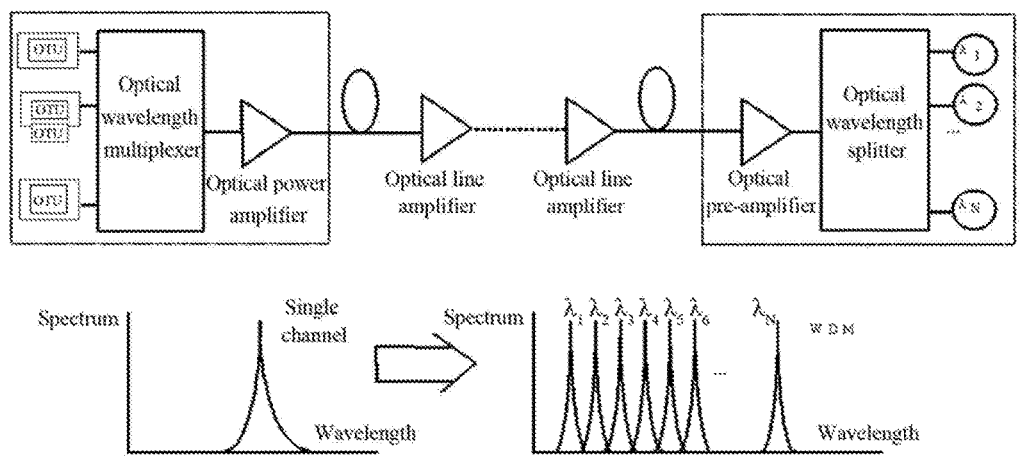
FIG. 1a is a schematic system architecture diagram applicable to DWDM according to some embodiments of the application.

The embodiments of the application are applicable to a DWDM optical module, and the DWDM technology is a technology to multiplex such a number of optical carriers onto a single optic fiber which are dense but spaced from each other by some wavelength interval to thereby improve the transmission performance. With the DWDM technology, optical signals at different wavelengths can be combined and transmitted in the same optic fiber. If 8 optical carriers are multiplexed, that is, 8 signals are transmitted in the same optic fiber, then the transmission capacity will be increased from 2.5 Gb/s to 20 Gb/s. As illustrated in FIG. 1a which is the system architectural diagram applicable to DWDM system, transmitters of optical modules receive optical signals, transmitted by respective OTUs (on each of which a number of optical modules can be plugged), at different wavelengths and with precisions and stabilities as required, the optical signals are multiplexed by an optical wavelength multiplexer and then input to an optical power amplifier. The amplified optical signals are further fed to an optic fiber for transmission, where optical line amplifiers may or may not be arranged as needed. The optical signals arriving at a receiver are amplified by an optical pre-amplifier, and then fed to an optical wavelength splitter and split into the original respective optical signals.

Figure 1B:
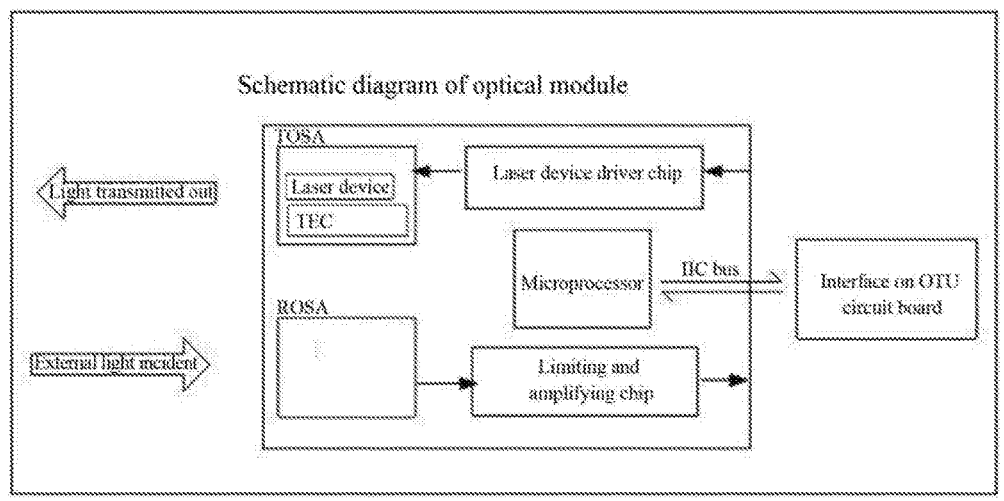
FIG. 1b is a schematic structural diagram of an optical module according to some embodiments of the application.

FIG. 1b is a schematic structural diagram of an optical module, where a laser device driver chip drives a Transmitter Optical Sub-assembly (TOSA) to transmit an optical signal according to a signal received from an OTU, and the optical signal transmitted by the TOSA is transmitted over an optic fiber. A Receiver Optical Sub-assembly (ROSA) converts the received optical signal into an electric signal, and the electric signal is processed by a limiting and amplifying chip, and then output to an OTU. A microprocessor in the optical module is connected with an interface on an OUT circuit board through an IIC bus to thereby communicate with the OTU. A TEC in the optical module can refrigerate or heat after being powered to thereby adjust temperature of the laser in the optical module so as to maintain constant temperature thereof.

Figure 2:
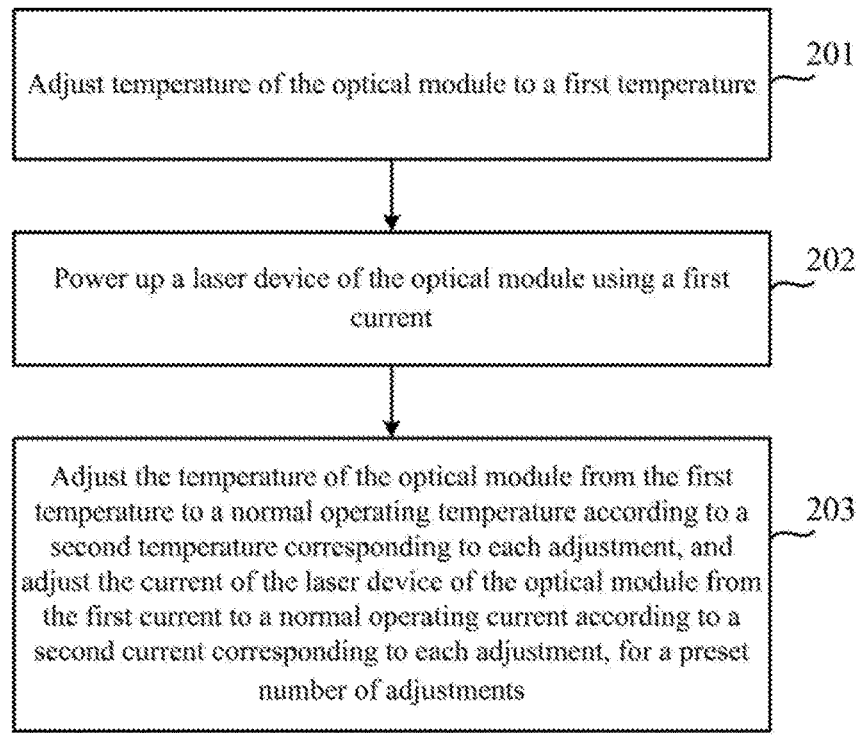
FIG. 2 is a schematic flowchart of a method for starting an optical module according to some embodiments of the application.

If optical signals at different wavelengths are multiplexed onto the same optic fiber for transmission, then respective multiplexed wavelength narrows in a limited frequency band, and if there are more optical signals with their wavelengths being multiplexed, then the windows will be narrower. While the optical module is being powered up, if there is such a change to some wavelength that exceeds a preset range before current of the optical module is adjusted to normal operating current, then the wavelengths in the adjacent windows may be affected. FIG. 2 illustrates a flow of starting an optical module according to some embodiments of the application, where the flow can be performed by an optical module starting device, which can be located in the optical module, or which can be the optical module.

As illustrated in FIG. 2, the flow includes the following steps 201-203.

The step 201 is to adjust temperature of the optical module to a first temperature.

The step 202 is to power up a laser device of the optical module using a first current.

The step 203 is to adjust the temperature of the optical module from the first temperature to a normal operating temperature according to a second temperature corresponding to each adjustment, and adjust the current of the laser device of the optical module from the first current to a normal operating current according to a second current corresponding to each adjustment, for a preset times of adjustment.

The first temperature of the optical module is higher than the normal operating temperature, the first temperature can be set empirically, and the first temperature can be set approximate to the normal operating temperature. If the normal operating temperature is 10° C., then the first temperature will be set at 10.2° C. or 10.1° C. If the first temperature is set more approximate to the normal operating temperature, then the wavelength of an optical signal generated by the laser device will fluctuate less while the optical module is being adjusted. The first temperature shall be the temperature of the laser device of the optical module in a real application, and since the temperature of the laser device cannot be measured, and the temperature of the laser device is approximate to the temperature of the optical module, the temperature of the optical module is measured instead in the embodiments of the application, but this is merely illustrative, and the embodiments of the application will not be limited thereto.

After the temperature of the optical module is adjusted to the first temperature, the laser device of the optical module will be powered up using the first current so that the laser device of the optical module transmits an optical signal.

The wavelength of the optical signal generated by the optical module is dependent upon the temperature of the optical module and the current of the laser. For example, the wavelength can correspond to the temperature and the current in such a relationship that is represented in the equation of λ=F1(T)+F2(I), where the first temperature can be represented as T0, and the first current can be represented as J0. The wavelength shall be stable while the optical module is being powered up so that the wavelength will not interfere with any other wavelength window while the optical module is being powered up. There is only 0.4 nm of a wavelength window in a 50 GHz system, so the stability of the wavelength shall be less than 0.2 nm.

After the laser device of the optical module is powered up using the first current, the temperature of the optical module will be adjusted to the normal operating temperature, and the current of the laser device will be adjusted to the normal operating current.

The temperature of the optical module is adjusted from the first temperature to the normal operating temperature, and the current of the laser device of the optical module is adjusted from the first current to the normal operating current, for the preset times of adjustment, each adjustment corresponding to the second current and the second temperature.

Stated otherwise, the temperature of the optical module is adjusted together with the current of the laser device of the optical module, and each time they are adjusted, firstly the temperature and then the current can be adjusted, and the second current and the second temperature as a result of each adjustment can be such that the wavelength of the optical signal generated by the optical module fluctuates so insignificantly that the generated optical signal is stable. After the laser device of the optical module is powered up using the first current, they are adjusted each time by firstly adjusting the temperature of the optical module, and then adjusting the current of the laser device, where they are adjusted each time by firstly dropping the temperature of the optical module by one level, and then raising the current of the laser device by one level. In the adjustment process, they are adjusted by firstly dropping the temperature of the optical module, and then raising the current of the laser device in a stepwise manner.

Here, the second current and the second temperature corresponding to each adjustment can be determined in any one of the following approaches.

First Approach

The second current and the second temperature can be preset. For example, experiments are conducted so that adjustment target temperature corresponding to each current adjustment is preset, and a correspondence relationship between the temperature of the optical module, and the current of the laser device is created. They are adjusted accordingly to the preset correspondence relationship between the temperature of the optical module, and the current of the laser device, while the laser device of the optical module is being powered up.

Second Approach

The second current and the second temperature corresponding to each adjustment can be determined according to the first temperature, the first current, the normal operating temperature, the normal operating current, and the preset times of adjustment.

The difference between the normal operating temperature and the first temperature is divided by the preset times of adjustment to thereby obtain a temperature drop by which the temperature of the optical module is to be dropped for each adjustment, while being dropped from the first temperature to the normal operating temperature so as to determine the second temperature corresponding to each adjustment. The difference between the normal operating current and the first current is divided by the preset times of adjustment to thereby obtain a current rise by which the current of the laser device of the optical module is to be raised for each adjustment, while being raised from the first current to the normal operating current so as to determine the second current corresponding to each adjustment.

By way of an example, if the normal operating temperature is 10° C., the first temperature is 10.1° C., the preset times of adjustment is 5, the normal operating current is 60 mA, and the first current is 10 mA, then the difference in temperature will be 0.1° C., and the difference in current will be 50 mA, so that the second current and the second temperature corresponding to each adjustment can be determined after the difference in temperature, and the difference in current are divided, particularly as depicted in Table 1.

TABLE 1

| | Second temperature | Second current |
|---|---|---|
| First adjustment | 10.08° C. | 20 mA |
| Second adjustment | 10.06° C. | 30 mA |
| Third adjustment | 10.04° C. | 40 mA |
| Fourth adjustment | 10.02° C. | 50 mA |
| Fifth adjustment | 10° C. | 60 mA |

Here, the difference in temperature and the difference in current may not be equally divided, but either or both the temperature and the current may be adjusted differently in two adjacent adjustments. For example, the temperature can be adjusted firstly to 10.09° C., and secondly to 10.06° C., and accordingly the current can be adjusted as such.

For the first adjustment above, firstly the temperature is dropped from 10.1° C. to 10.08° C., and then the current is raised from 10 mA to 20 mA.

If the method for starting an optical module according to some embodiments of the application is applicable to an array of laser devices, then if the preset times of adjustment is larger, then the wavelength of the optical signal generated by the laser device of the optical module being powered up will fluctuate less, and the optical signal will have a less influence upon optical signals in adjacent channels.

Figure 3:
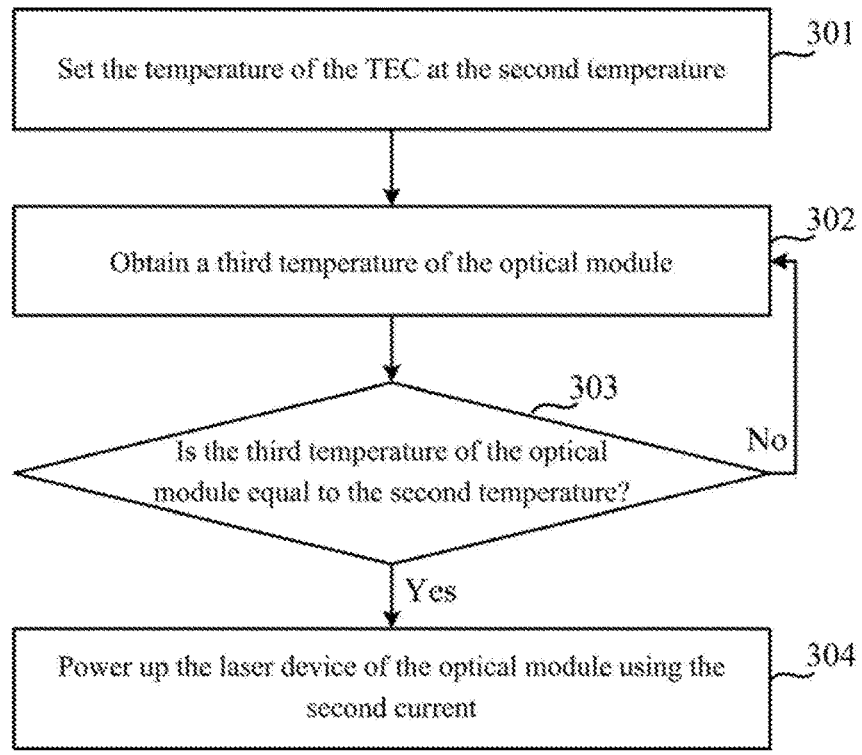
FIG. 3 is a schematic flowchart of an adjusting process according to some embodiments of the application.

For each adjustment above, FIG. 3 illustrates a flow of each adjustment according to an embodiment of the application.

As illustrated in FIG. 3, the flow particularly includes the following steps 301-303.

The step 301 is to set the temperature of the TEC at the second temperature.

The temperature of the optical module is adjusted through the TEC by setting the temperature at the second temperature on the TEC.

The step 302 is to obtain a third temperature of the optical module. After the temperature is set on the TEC, the flow waits until the temperature of the optical module is dropped to the second temperature, so the third temperature of the optical module needs to be obtained and checked, where the third temperature is the real temperature of the optical module, and the current of the laser device will not be adjusted until the real temperature of the optical module reaches the second temperature.

The step 303 is to determine whether the third temperature of the optical module is equal to the second temperature, and if so, then the flow will proceed to the step 304, and otherwise, the flow will return to the step 302. After it is determined that the third temperature of the optical module is equal to the second temperature, adjusting of the current of the laser device can be started, and if the third temperature of the optical module is not equal to the second temperature, then the third temperature of the optical module will be further obtained until the third temperature of the optical module is equal to the second temperature.

The step 304 is to power up the laser device of the optical module using the second current.

In some embodiments of the application, there is the same interval of time between every two adjacent adjustments.

The optical module according to some embodiments of the application includes an array of laser devices, where optical signals emitted by the laser devices in the array are multiplexed by the optical wavelength multiplexer, and then fed to the optic fiber for transmission. With the flow above of starting the optical module, the wavelengths of the optical signals emitted by the laser devices in the array can be kept stable, while the optical module is being powered up, so that their wavelengths will not be offset, and the optical signals will not interfere with adjacent wavelength channels.

In some embodiments of the application, the temperature of the optical module is adjusted to the first temperature higher than the normal operating temperature of the optical module. The laser device of the optical module is powered up using the first current lower than the normal operating current of the laser device. The temperature of the optical module is adjusted from the first temperature to the normal operating temperature, and the current of the laser device of the optical module is adjusted from the first current to the normal operating current, for the preset times of adjustment, each adjustment corresponding to the second current and the second temperature. Both the current and the temperature of the optical module can be adjusted to the normal operating current and the normal operating temperature for the preset times of adjustment, and the second current and the second temperature corresponding to each adjustment can be such that the wavelength of the optical signal generated by the optical module is kept stable, thus avoiding the optical signal from interfering with any adjacent wavelength channels while the optical module is being coldly started.

Figure 4:
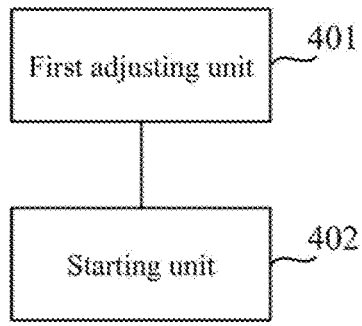
FIG. 4 is a schematic structural diagram of an apparatus for starting an optical module according to some embodiments of the application.

FIG. 4 illustrates an apparatus for starting an optical module according to some embodiments of the application, where the apparatus can perform the flow of starting the optical module, and the apparatus can be located in the optical module, or can be the optical module.

As illustrated in FIG. 4, the optical module includes a first adjusting unit 401 and a starting unit 402.

The first adjusting unit 401 is configured to adjust temperature of the optical module to a first temperature higher than a normal operating temperature of the optical module.

The starting unit 402 is configured to power up a laser device of the optical module using a first current lower a normal operating current of the laser device, to adjust the temperature of the optical module from the first temperature to the normal operating temperature according to a second temperature corresponding to each adjustment, and to adjust the current of the laser device of the optical module from the first current to the normal operating current according to a second current corresponding to each adjustment, for a preset times of adjustment.

The starting unit 402 is further configured to determine the second current and the second temperature corresponding to each adjustment in such a way that:

the second current and the second temperature is preset; or the second current and the second temperature corresponding to each adjustment are determined according to the first temperature, the first current, the normal operating temperature, the normal operating current, and the preset times of adjustment.

The starting unit 402 is further configured to:

divide the difference between the normal operating temperature and the first temperature by the preset times of adjustment, and to obtain a temperature drop by which the temperature of the optical module is to be dropped for each adjustment, while being dropped from the first temperature to the normal operating temperature, so as to determine the second temperature corresponding to each adjustment; and divide the difference between the normal operating current and the first current by the preset times of adjustment to thereby obtain a current rise by which the current of the laser device of the optical module is to be raised for each adjustment, while being raised from the first current to the normal operating current, so as to determine the second current corresponding to each adjustment.

The starting unit 402 is further configured, for each adjustment, to perform the following:

set temperature of a TEC at the second temperature; and obtain a third temperature of the optical module, and if the third temperature of the optical module is equal to the second temperature, power up the laser device of the optical module using the second current.

There is the same interval of time between every two adjacent adjustments.

The optical module is a DWDM optical module.

Figure 5:
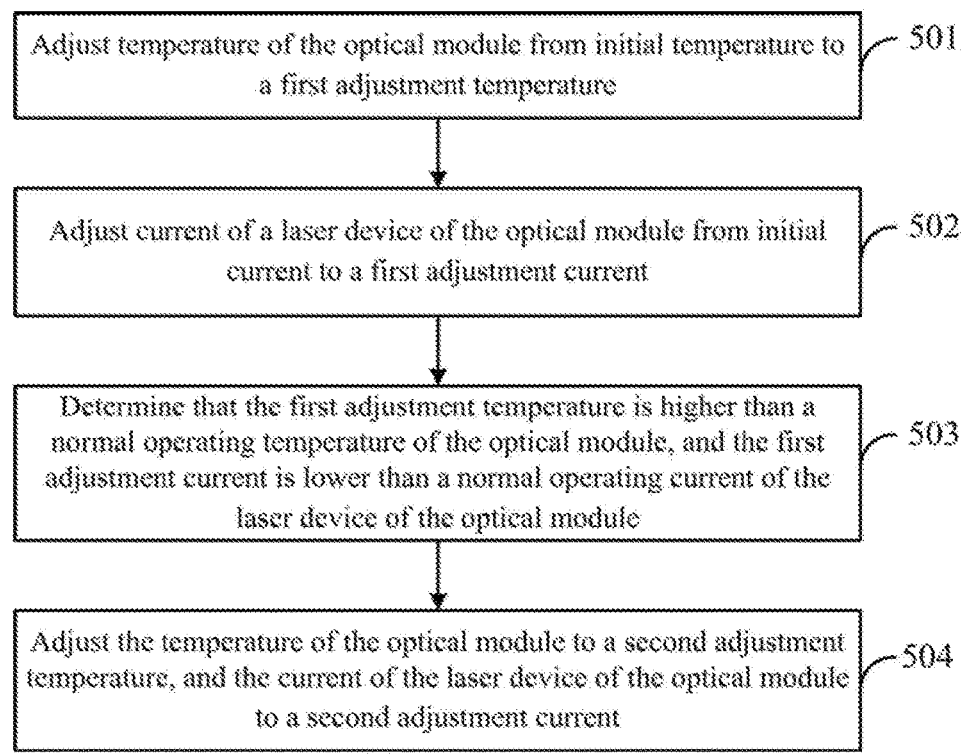
FIG. 5 is a schematic flowchart of another method for starting an optical module according to some embodiments of the application.

Some embodiments of the application further provide a method for starting an optical module as illustrated in FIG. 5, where the method includes steps 501-504.

The step 501 is to adjust temperature of the optical module from initial temperature to a first adjustment temperature.

The step 502 is to adjust current of a laser device of the optical module from initial current to a first adjustment current.

The step 503 is to determine that the first adjustment temperature is higher than a normal operating temperature of the optical module, and the first adjustment current is lower than a normal operating current of the laser device of the optical module.

The step 504 is to adjust the temperature of the optical module to a second adjustment temperature, adjust and the current of the laser device of the optical module to a second adjustment current.

Here, the first adjustment temperature is lower than the initial temperature and higher than the second adjustment temperature, and the second adjustment temperature is higher than or equal to the normal operating temperature. The first adjustment current is higher than the initial current and lower than the second adjustment current, and the second adjustment current is lower than or equal to the normal operating current.

The first adjustment temperature of the optical module is higher than the normal operating temperature, and the first adjustment temperature can be set empirically. For example, the first adjustment temperature can be set approximate to the normal operating temperature. If the normal operating temperature is 10° C., then the first adjustment temperature will be set at 10.2° C. or 10.1° C. If the first adjustment temperature is set more approximate to the normal operating temperature, then the wavelength of an optical signal generated by the laser device will fluctuate less while the optical module is being adjusted. The first adjustment temperature and the second adjustment temperature shall be temperature of the laser device of the optical module in a real application, and since the temperature of the laser device cannot be measured, and the temperature of the laser device is approximate to the temperature of the optical module, the temperature of the optical module is measured instead in the embodiments of the application. This is merely illustrative, and the embodiments of the application will not be limited thereto.

After the temperature of the optical module is adjusted to the first adjustment temperature, the laser device of the optical module will be powered up using the first adjustment current so that the laser device of the optical module transmits an optical signal.

The wavelength of the optical signal generated by the optical module is dependent upon the temperature of the optical module, and the current of the laser. For example, the wavelength can correspond to the temperature and the current in such a relationship that is represented in the equation of $\lambda=F1(T)+F2(I)$, where the first adjustment temperature can be represented as T0, and the first adjustment current can be represented as I0. The wavelength shall be stable while the optical module is being powered up so that the wavelength will not interfere with any other wavelength window, while the optical module is being powered up. There is only 0.4 nm of a wavelength window in a 50 GHz system, so the stability of the wavelength shall be less than 0.2 nm.

After the laser device of the optical module is powered up using the first adjustment current, the temperature of the optical module will be adjusted to the second adjustment temperature, and the current of the laser device will be adjusted to the second adjustment current.

The temperature of the optical module is adjusted together with the current of the laser device of the optical module, and each time they are adjusted, firstly the temperature and then the current can be adjusted, and the first adjustment current and the first adjustment temperature as a result of the adjustment, and the second adjustment current and the second adjustment current as a result of the adjustment, can be such that the wavelength of the optical signal generated by the optical module fluctuates so insignificantly that the generated optical signal is stable. After the laser device of the optical module is powered up using the first adjustment current, they are adjusted for the second adjustment by firstly adjusting the temperature of the optical module, and then the current of the laser device, where they are adjusted each time by firstly dropping the temperature of the optical module by one level, and then raising the current of the laser device by one level. In the adjustment process, they are adjusted by firstly dropping the temperature of the optical module, and then raising the current of the laser device in a stepwise manner.

Here, the first adjustment temperature, the first adjustment current, the second adjustment temperature, and the second adjustment current can be preset. A correspondence relationship between the temperature of the optical module, and the current of the laser device, is created according to experimental result. They are adjusted accordingly to the preset correspondence relationship between the temperature of the optical module, and the current of the laser device, while the laser device of the optical module is being powered up.

Alternatively the first adjustment temperature and the second adjustment temperature can be obtained by equally or unequally dividing the difference in temperature between the initial temperature and the normal operating temperature. Similarly, the first adjustment current and the second adjustment current can also be obtained by dividing the difference in current between the normal operating current and the initial current under a corresponding division rule to the rule for dividing the difference in temperature.

When the method for starting an optical module according to some embodiments of the application is applicable to an array of laser devices, if the preset times of adjustment is larger, then the wavelength of the optical signal generated by the laser device of the optical module being powered up will fluctuate less, and the optical signal will have a less influence upon optical signals in adjacent channels.

Figure 6:
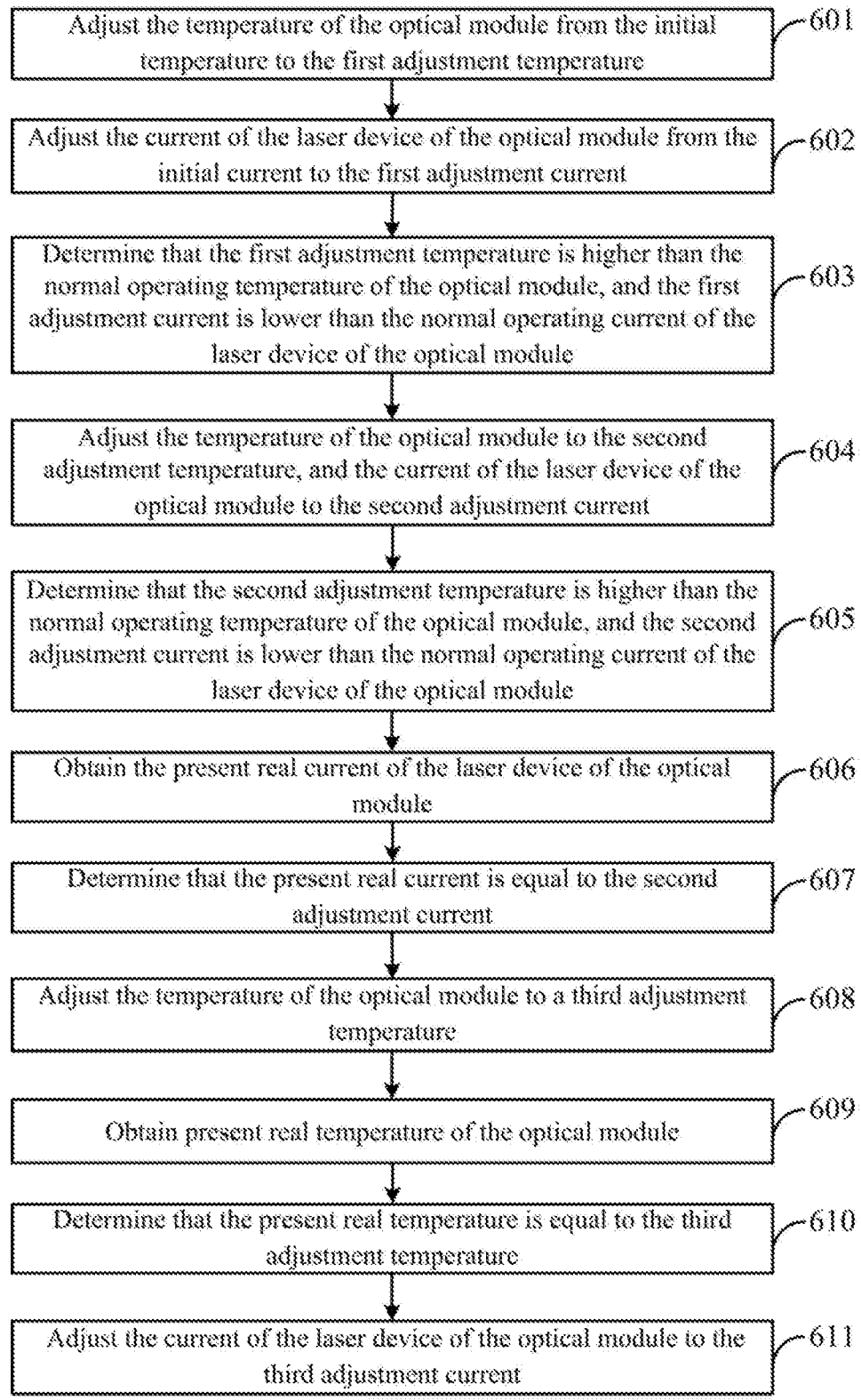
FIG. 6 is another schematic flowchart of the other method for starting an optical module according to some embodiments of the application.

There are many times of adjustment in another flow of the other method for starting an optical module according to some embodiments of the application. As illustrated in FIG. 6, the flow includes steps 601-611.

The step 601 is to adjust the temperature of the optical module from the initial temperature to the first adjustment temperature.

The step 602 is to adjust the current of the laser device of the optical module from the initial current to the first adjustment current.

The step 603 is to determine that the first adjustment temperature is higher than the normal operating temperature of the optical module, and the first adjustment current is lower than the normal operating current of the laser device of the optical module.

The step 604 is to adjust the temperature of the optical module to the second adjustment temperature, and the current of the laser device of the optical module to the second adjustment current.

The step 605 is to determine that the second adjustment temperature is higher than the normal operating temperature of the optical module, and the second adjustment current is lower than the normal operating current of the laser device of the optical module so that the flow decides to further adjust the temperature of the optical module, and the current applied to the laser device of the optical module.

The step 606 is to obtain the present real current of the laser device of the optical module.

The step 607 is to determine that the present real current is equal to the second adjustment current.

The step 608 is to adjust the temperature of the optical module to a third adjustment temperature.

The step 609 is to obtain present real temperature of the optical module.

The step 610 is to determine that the present real temperature is equal to the third adjustment temperature.

The step 611 is to adjust the current of the laser device of the optical module to a third adjustment current.

In order to adjust the temperature of the optical module, the present real temperature of the optical module will be obtained, it will be determined whether the present real temperature is equal to the second adjustment temperature, and the present real current of the laser device of the optical module will not be adjusted to the second adjustment current until the real temperature of the optical module reaches the second adjustment temperature. After the present real current of the laser device of the optical module is adjusted to the second adjustment current, the second adjustment current is not the normal operating current of the laser device of the optical module, and the second adjustment temperature is not the normal operating temperature of the optical module, so the temperature of the optical module, and the current applied to the laser device of the optical module will be further adjusted. Similarly, before the current of the laser device of the optical module is adjusted to the third adjustment current, it will also be determined that the present real temperature of the optical module has been dropped to the third adjustment temperature, and if the present real temperature of the optical module is still higher than the third adjustment temperature, then the present real temperature of the optical module will be further obtained, and the present real current of the laser device of the optical module will not be adjusted to the third adjustment current until the present real temperature of the optical module reaches the third adjustment temperature.

The difference between the second adjustment temperature and the first adjustment temperature is equal to the difference between the third adjustment temperature and the second adjustment temperature, and the difference between the second adjustment current and the first adjustment current is equal to the difference between the third adjustment current and the second adjustment current.

All of the first adjustment temperature, the first adjustment current, the second adjustment temperature, the second adjustment current, the third adjustment temperature, and the third adjustment current can be preset.

Both the first adjustment temperature and the first adjustment current are dependent upon times of adjustment required for adjusting the temperature of the laser device of the optical module from the initial temperature to the normal operating temperature in the relationship equation of:

$$T1 = T0 + (T0 - T)/N, \text{ and } I1 = I0 + (I0 - I)/N,$$

where T0 represents the initial temperature of the laser device of the optical module, I0 represents the initial current, T1 represents the first adjustment temperature, I1 represents the first adjustment current, T represents the normal operating temperature, I represents the normal operating current, and N represents times of adjustments.

The optical module is a Dense Wavelength Division Multiplexing (DWDM) optical module.

In some embodiments of the application, there is the same interval of time between every two adjacent adjustments.

The optical module according to some embodiments of the application includes an array of laser devices, where optical signals emitted by the laser devices in the array are multiplexed by the optical wavelength multiplexer, and then fed to the optic fiber for transmission, and with the flow above of starting the optical module, the wavelengths of the optical signals emitted by the laser devices in the array can be kept stable while the optical module is being powered up, so that their wavelengths will not be offset, and the optical signals will not interfere with adjacent wavelength channels.

With some embodiments of the application, the temperature of the optical module is adjusted to the first adjustment temperature higher than the normal operating temperature of the optical module, and the laser device of the optical module is powered up using the first adjustment current lower than the normal operating current of the laser device. Then the temperature of the optical module is adjusted from the first adjustment temperature to the second adjustment temperature, and the current of the laser device of the optical module is adjusted from the first adjustment current to the second adjustment current, so that the real temperature of the optical module is approximate or equal to the normal operating temperature, and the real current applied to the laser device of the optical module is approximate or equal to the normal operating current. The current and the temperature of the optical module is adjusted progressively until they are approximate or equal to the normal operating current and the normal operating temperature, where they are adjusted to the first adjustment temperature and the first adjustment current for the first time so that the wavelength of the optical signal generated by the optical module is kept stable, and they are adjusted to the second adjustment temperature and the second adjustment current for the second time so that the wavelength of the optical signal generated by the optical module is also kept stable. In this way, the wavelength of the optical signal can be avoided from interfering with any adjacent wavelength channel while the optical module is being coldly started.

Figure 7:
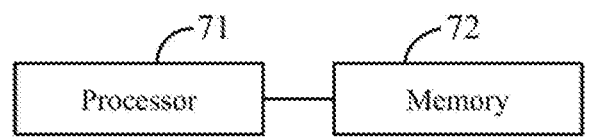
FIG. 7 is a schematic structural diagram of another apparatus for starting an optical module according to some embodiments of the application.

Some embodiments of the application provide another apparatus for starting an optical module as illustrated in FIG. 7, where the apparatus includes at least one processor 71 and a memory 72. The memory 72 stores therein program instructions executable by the at least one processor 71, and the instructions are executed by the at least one processor 71 to enable the at least one processor 71 to perform the steps of:

adjusting temperature of the optical module from initial temperature to a first adjustment temperature, and current of a laser device of the optical module from initial current to a first adjustment current; and determining whether the first adjustment temperature is higher than a normal operating temperature of the optical module, and the first adjustment current is lower than a normal operating current of the laser device of the optical module; and if so, then adjusting the temperature of the optical module to a second adjustment temperature, and the current of the laser device of the optical module to a second adjustment current.

Where the temperature of the optical module is adjusted to the second adjustment temperature, and the current of the laser device of the optical module is adjusted to the second adjustment current on the precondition that the first adjustment temperature is higher than the normal operating temperature of the optical module, and the first adjustment current is lower than the normal operating current of the laser device of the optical module.

The first adjustment temperature can be set empirically, for example, the first adjustment temperature can be set approximate to the normal operating temperature. If the normal operating temperature is 10° C., then the first adjustment temperature will be set at 10.2° C. or 10.1° C. If the first adjustment temperature is set more approximate to the normal operating temperature, then the wavelength of an optical signal generated by the laser device will fluctuate less while the optical module is being adjusted. The first adjustment temperature and the second adjustment temperature shall be temperature of the laser device of the optical module in a real application, and since the temperature of the laser device cannot be measured, and the temperature of the laser device is approximate to the temperature of the optical module, the temperature of the optical module is measured instead in the embodiments of the application. This is merely illustrative, and the embodiments of the application will not be limited thereto.

After the temperature of the optical module is adjusted to the first adjustment temperature, the laser device of the optical module will be powered up using the first adjustment current so that the laser device of the optical module transmits an optical signal.

After the laser device of the optical module is powered up using the first adjustment current, the temperature of the optical module will be adjusted to the second adjustment temperature, and the current of the laser device will be adjusted to the second adjustment current.

The temperature of the optical module is adjusted together with the current of the laser device of the optical module, and each time they are adjusted, firstly the temperature and then the current can be adjusted, and the first adjustment current and the first adjustment temperature as a result of the adjustment, and the second adjustment current and the second adjustment current as a result of the adjustment can be such that the wavelength of the optical signal generated by the optical module fluctuates so insignificantly that the generated optical signal is stable. After the laser device of the optical module is powered up using the first adjustment current, they are adjusted for the second adjustment by firstly adjusting the temperature of the optical module, and then the current of the laser device, where they are adjusted each time by firstly dropping the temperature of the optical module by one level, and then raising the current of the laser device by one level. In the adjustment process, they are adjusted by firstly dropping the temperature of the optical module, and then raising the current of the laser device in a stepwise manner.

Here, the first adjustment temperature, the first adjustment current, the second adjustment temperature, and the second adjustment current can be preset. A correspondence relationship between the temperature of the optical module, and the current of the laser device is created according to experimental result. They are adjusted accordingly to the preset correspondence relationship between the temperature of the optical module, and the current of the laser device while the laser device of the optical module is being powered up.

Alternatively the first adjustment temperature and the second adjustment temperature can be obtained by equally or unequally dividing the difference in temperature between the initial temperature and the normal operating temperature. Similarly, the first adjustment current and the second adjustment current can also be obtained by dividing the difference in current between the normal operating current and the initial current under a corresponding division rule to the rule for dividing the difference in temperature.

When the apparatus for starting an optical module according to some embodiments of the application is applicable to an array of laser devices, if the preset times of adjustment is larger, then the wavelength of the optical signal generated by the laser device of the optical module being powered up will fluctuate less, and the optical signal will have a less influence upon optical signals in adjacent channels.

The instructions stored in the memory 72 are executed by the at least one processor 71 to enable the at least one processor 71 to further perform the steps of:

determining whether the second adjustment temperature is higher than the normal operating temperature of the optical module, and the second adjustment current is lower than the normal operating current of the laser device of the optical module; and if so, then deciding that the temperature of the optical module, and the current applied to the laser device of the optical module need further be adjusted; and adjusting the temperature of the optical module to a third adjustment temperature, and the current of the laser device of the optical module to a third adjustment current.

The instructions stored in the memory 72 are executed by the at least one processor 71 to enable the at least one processor 71 to further perform the steps of:

before the temperature of the optical module is adjusted to the third adjustment temperature, obtaining present real current of the laser device of the optical module, and determining that the present real current is equal to the second adjustment current.

The instructions stored in the memory 72 are executed by the at least one processor 71 to enable the at least one processor 71 to further perform the steps of:

before the current of the optical module is adjusted to the third adjustment current, obtaining present real temperature of the optical module, and determining that the present real temperature is equal to the third adjustment temperature.

In order to adjust the temperature of the optical module, the present real temperature of the optical module will be obtained, it will be determined whether the present real temperature is equal to the second adjustment temperature, and the present real current of the laser device of the optical module will not be adjusted to the second adjustment current until the real temperature of the optical module reaches the second adjustment temperature. After the present real current of the laser device of the optical module is adjusted to the second adjustment current, the second adjustment current is not the normal operating current of the laser device of the optical module, and the second adjustment temperature is not the normal operating temperature of the optical module, so the temperature of the optical module, and the current applied to the laser device of the optical module will be further adjusted. Similarly before the current of the laser device of the optical module is adjusted to the third adjustment current, it will also be determined that the present real temperature of the optical module has been dropped to the third adjustment temperature. If the present real temperature of the optical module is still higher than the third adjustment temperature, then the present real temperature of the optical module will be further obtained, and the present real current of the laser device of the optical module will not be adjusted to the third adjustment current until the present real temperature of the optical module reaches the third adjustment temperature.

The difference between the second adjustment temperature and the first adjustment temperature is equal to the difference between the third adjustment temperature and the second adjustment temperature. The difference between the second adjustment current and the first adjustment current is equal to the difference between the third adjustment current and the second adjustment current.

All of the first adjustment temperature, the first adjustment current, the second adjustment temperature, the second adjustment current, the third adjustment temperature, and the third adjustment current can be preset.

Both the first adjustment temperature and the first adjustment current are dependent upon times of adjustments required for adjusting the temperature of the laser device of the optical module from the initial temperature to the normal operating temperature in the relationship equation of:

$$T1=T0+(T0-T)/N, \text{ and } I1=I0+(I0-I)/N,$$

where T0 represents the initial temperature of the laser device of the optical module, J0 represents the initial current, T1 represents the first adjustment temperature, I1 represents the first adjustment current, T represents the normal operating temperature, I represents the normal operating current, and N represents times of adjustments.

The optical module is a Dense Wavelength Division Multiplexing (DWDM) optical module. Moreover, in some embodiments of the application, there is the same interval of time between every two adjacent adjustments.

The application has been described in a flowchart and/or a block diagram of the method, the device (system) and the computer program product according to the embodiments of the application. It shall be appreciated that respective flows and/or blocks in the flowchart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flowchart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flowchart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flowchart and/or the block(s) of the block diagram.

Although the preferred embodiments of the application have been described, those skilled in the art benefiting from the underlying inventive concept can make additional modifications and variations to these embodiments. Therefore, the appended claims are intended to be construed as encompassing the preferred embodiments and all the modifications and variations coming into the scope of the application.

Evidently, those skilled in the art can make various modifications and variations to the application without departing from scope of the application. Thus, the application is also intended to encompass these modifications and variations thereto so long as the modifications and variations come into the scope of the claims appended to the application and their equivalents.

The invention claimed is:

1. A method of starting an optical module, the method comprising:
adjusting temperature of a laser device of the optical module to a first temperature higher than a normal operating temperature of the laser device of the optical module;
powering up the laser device of the optical module using a first current lower than a normal operating current of the laser device; and
adjusting the temperature of the laser device of the optical module from the first temperature to the normal operating temperature according to a second temperature corresponding to each adjustment, and adjusting the current of the laser device of the optical module from the first current to the normal operating current according to a second current corresponding to each adjustment, for a preset times of adjustment;
wherein the second temperature and the second current corresponding to each adjustment are determined in such a way that:
dividing a difference between the normal operating temperature and the first temperature by the preset times of adjustment, and obtaining a temperature drop by which the temperature of the laser device of the optical module is to be dropped for each adjustment while being dropped from the first temperature to the normal operating temperature so as to determine the second temperature corresponding to each adjustment; and
dividing a difference between the normal operating current and the first current by the preset times of adjustment, and obtaining a current rise by which the current of the laser device of the optical module is to be raised for each adjustment while being raised from the first current to the normal operating current so as to determine the second current corresponding to each adjustment.

2. The method according to claim 1, wherein for each adjustment the method further comprises:
setting temperature of a Thermoelectric Cooler (TEC) at the second temperature; and
obtaining a third temperature of the laser device of the optical module, and if the third temperature of the laser device of the optical module is equal to the second temperature, then powering up the laser device of the optical module using the second current.

3. The method according to claim 1, wherein the optical module is a Dense Wavelength Division Multiplexing (DWDM) optical module.

4. A method of starting an optical module according to claim 1, the method comprising:
adjusting temperature of a laser device of the optical module from initial temperature to a first adjustment temperature;
adjusting current of the laser device of the optical module from initial current to a first adjustment current;
determining whether the first adjustment temperature is higher than a normal operating temperature of the laser device of the optical module, and the first adjustment current is lower than a normal operating current of the laser device of the optical module; and
if so, then adjusting the temperature of the laser device of the optical module to a second adjustment temperature, and the current of the laser device of the optical module to a second adjustment current.

5. The method according to claim 4, wherein the method further comprises:
determining whether the second adjustment temperature is higher than the normal operating temperature of the laser device of the optical module, and the second adjustment current is lower than the normal operating current of the laser device of the optical module; and
if so, then adjusting the temperature of the laser device of the optical module to a third adjustment temperature, and the current of the laser device of the optical module to a third adjustment current.

6. The method according to claim 5, wherein before the temperature of the laser device of the optical module is adjusted to the third adjustment temperature, the method further comprises:
obtaining present real current of the laser device of the optical module; and
determining that the present real current is equal to the second adjustment current.

7. The method according to claim 5, wherein before the current of the laser device of the optical module is adjusted to the third adjustment current, the method further comprises:
obtaining present real temperature of the laser device of the optical module; and
determining that the present real temperature is equal to the third adjustment temperature.

8. The method according to claim 5, wherein the difference between the second adjustment temperature and the first adjustment temperature is equal to the difference between the third adjustment temperature and the second adjustment temperature; and the difference between the second adjustment current and the first adjustment current is equal to the difference between the third adjustment current and the second adjustment current.

9. The method according to claim 5, wherein the method further comprises:
all of the first adjustment temperature, the first adjustment current, the second adjustment temperature, the second adjustment current, the third adjustment temperature, and the third adjustment current are preset.

10. The method according to claim 4, wherein if the initial temperature of the laser device of the optical module is T0, the initial current is I0, the first adjustment temperate is T1, the first adjustment current is I1, the normal operating temperature is T, the normal operating current is I, and the times of adjustment is N, wherein the times of adjustment is the times of adjustment required for adjusting the temperature of the laser device of the optical module from the initial temperature to the normal operating temperature, then:

$$T1=T0+(T0-T)/N, \text{ and } I1=I0+(I0-I)/N.$$

11. An apparatus to start an optical module, the apparatus comprising:
a first adjusting unit configured to adjust temperature of a laser device of the optical module to a first temperature higher than a normal operating temperature of the optical module; and
a starting unit configured to power up the laser device of the optical module using a first current lower than a normal operating current of the laser device, and adjust the temperature of the laser device of the optical module from the first temperature to the normal operating temperature according to a second temperature corresponding to each adjustment, and adjust the current of the laser device of the optical module from the first current to the normal operating current according to a second current corresponding to each adjustment, for a preset times of adjustment;

wherein the starting unit is further configured to determine the second temperature and the second current corresponding to each adjustment in such a way that:

dividing a difference between the normal operating temperature and the first temperature by the preset times of adjustment, and obtaining a temperature drop by which the temperature of the laser device of the optical module is to be dropped for each adjustment while being dropped from the first temperature to the normal operating temperature so as to determine the second temperature corresponding to each adjustment; and dividing a difference between the normal operating current and the first current by the preset times of adjustment, and obtaining a current rise by which the current of the laser device of the optical module is to be raised for each adjustment while being raised from the first current to the normal operating current so as to determine the second current corresponding to each adjustment.

12. The apparatus according to claim 11, wherein for each adjustment the starting unit is further configured to:
set temperature of a Thermoelectric Cooler (TEC) at the second temperature; and
obtain a third temperature of the laser device of the optical module, and if the third temperature of the optical module is equal to the second temperature, power up the laser device of the optical module using the second current.

13. The apparatus according to claim 11, wherein the optical module is a Dense Wavelength Division Multiplexing (DWDM) optical module.

* * * * *